United States Patent
Cheng et al.

(10) Patent No.: US 10,429,568 B2
(45) Date of Patent: Oct. 1, 2019

(54) DYNAMIC RANDOM ACCESS MEMORY

(71) Applicant: ALSON TECHNOLOGY LIMITED, Kowloon (HK)

(72) Inventors: Han-Hung Cheng, Zhubei (TW); Chi-Fen Kuo, Zhubei (TW)

(73) Assignee: ALSON TECHNOLOGY LIMITED, Kowloon (HK)

( * ) Notice: Subject to any disclaimer, the term of this patent is extended or adjusted under 35 U.S.C. 154(b) by 93 days.

(21) Appl. No.: 15/889,632

(22) Filed: Feb. 6, 2018

(65) Prior Publication Data

US 2018/0164496 A1 Jun. 14, 2018

Related U.S. Application Data

(63) Continuation-in-part of application No. 14/928,328, filed on Oct. 30, 2015, now abandoned.

(51) Int. Cl.
| | |
|---|---|
| *F21V 8/00* | (2006.01) |
| *F21V 33/00* | (2006.01) |
| *G11C 11/401* | (2006.01) |
| *G11C 5/04* | (2006.01) |
| *H01L 25/16* | (2006.01) |

(52) U.S. Cl.
CPC ............ *G02B 6/0043* (2013.01); *F21V 33/00* (2013.01); *G02B 6/0001* (2013.01); *G11C 5/04* (2013.01); *G11C 11/401* (2013.01); *H01L 25/16* (2013.01)

(58) Field of Classification Search
CPC ..... G02B 6/0043; G02B 6/0001; F21V 33/00; G11C 5/04; G11C 11/401; H01L 25/16; H05B 37/0209; H05K 5/00
See application file for complete search history.

(56) References Cited

U.S. PATENT DOCUMENTS

2005/0141199 A1 6/2005 Chiou et al.
2013/0039016 A1* 2/2013 Wu .................. G06F 1/185
　　　　　　　　　　　　　　　　　　361/729
(Continued)

FOREIGN PATENT DOCUMENTS

| CN | 203378153 U | * | 1/2014 |
| CN | 203378153 U | | 1/2014 |
| TW | M448772 U | | 3/2013 |

OTHER PUBLICATIONS

Translation of CN 203378153 U, Translated Apr. 20, 2017 (Year: 2014).*
Translation of CN 203378153 U, Translated Apr. 20, 2017 by EPO.

*Primary Examiner* — Jong-Suk (James) Lee
*Assistant Examiner* — Christopher E Dunay
(74) *Attorney, Agent, or Firm* — Muncy, Geissler, Olds & Lowe, PC

(57) ABSTRACT

A dynamic random access memory is provided, including a main body and a transmission port. The main body has a substrate, a light-emitting module and a light-guiding portion. The substrate is provided with a memory module, the light-emitting module has a carrier board and a light-emitting portion disposed on the carrier board, the light-guiding portion is arranged corresponding to the light-emitting portion, and at least a part of light from the light-emitting portion is projected to outside of the dynamic random access memory through the light-guiding portion. The transmission port is disposed on the substrate, and the transmission port is electrically connected with the memory module.

9 Claims, 5 Drawing Sheets

(56) References Cited

U.S. PATENT DOCUMENTS

| | | | |
|---|---|---|---|
| 2013/0063968 A1 | 3/2013 | Neugebauer et al. | |
| 2014/0177195 A1 | 6/2014 | Yang | |
| 2016/0212825 A1* | 7/2016 | Kuo | G06F 3/06 |
| 2016/0334559 A1* | 11/2016 | Kuo | G02B 6/0001 |
| 2016/0374181 A1* | 12/2016 | Kuo | F21V 23/0442 |

* cited by examiner

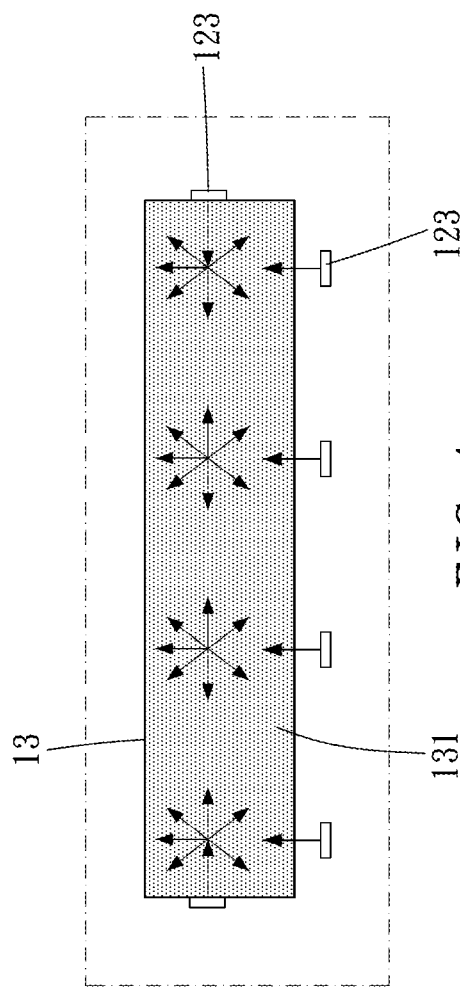
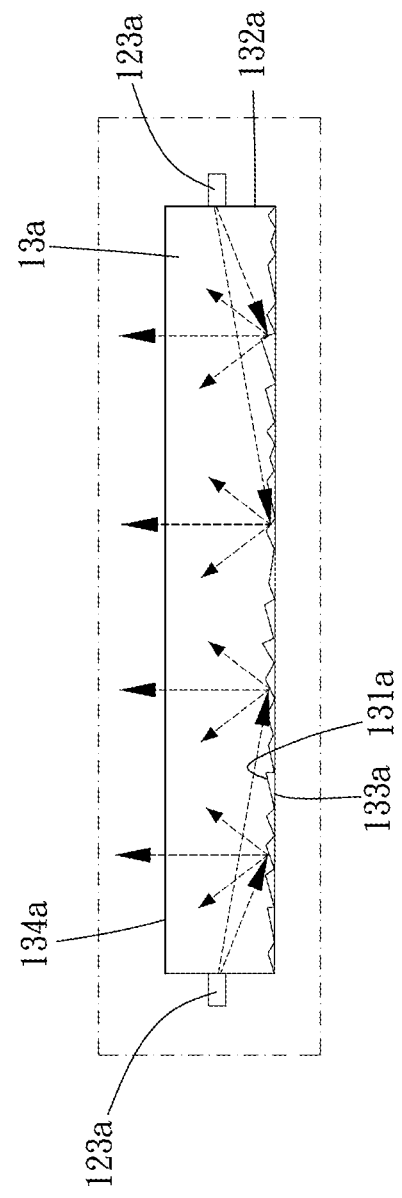

DYNAMIC RANDOM ACCESS MEMORY

FIELD OF THE INVENTION

The present invention is a CIP of application Ser. No. 14/928,328, filed Oct. 30, 2015, the entire contents of which are hereby incorporated by reference.

BACKGROUND OF THE INVENTION

Description of the Prior Art

A dynamic random access memory as disclosed in TWM448772 includes a main body, at least one light-emitting diode and one light-penetrable light-guiding body. The light-emitting diode is disposed in the main body and electrically connected with the main body, the main body is provided with a memory module, the light-guiding portion is disposed in the main body and covers the light-emitting diode, and light from the light-emitting diode can penetrate through the light-guiding body.

However, in this type of dynamic random access memory, the light-emitting portion (LED) and a substrate are integrally connected; therefore, if the light-emitting portion is damaged, the substrate and the memory module need to be replaced together, which is money-consuming and resource-wasting.

In addition, when a heat-dissipating efficiency of the light-emitting portion is too low, the substrate may be too hot, and the memory module may be damaged. Moreover, the whole set of dynamic random access memory may need to be replaced.

Besides, the light-guiding portion cannot effectively make the light emitted be distributed evenly, so the dynamic random access memory cannot emit light evenly and is less pleasant to the eye.

CN 203378153 discloses that the main body is integrally formed of one piece, and the carrier board and the substrate are each integrally formed as a part of the one-piece main body. Additionally, the transmission port is also integrally formed as a part of the one-piece main body, and the light-emitting portion is fixedly disposed on the substrate. That is, none of detachable carrier board is provided, and the substrate and the light-emitting module are not separatable from each other. Therefore, when the light-emitting portion is damaged, the substrate and the memory module need to be replaced together, which is money-consuming and resource-wasting. The light-guiding portion is cylindrical and hard to be steadily assembled to the one-piece main body.

The present invention has arisen to mitigate and/or obviate the afore-described disadvantages.

SUMMARY OF THE INVENTION

The major object of the present invention is to provide a dynamic random access memory in which a substrate and a light-emitting portion are separately arranged, so when the light-emitting portion is damaged, a user only needs to replace a carrier board having the light-emitting portion instead of replacing a whole set of the dynamic random access memory.

In addition, the light-emitting portion is disposed on the carrier board instead of sharing a heat-dissipating area with the substrate; therefore, a heat-dissipating efficiency is elevated, and a risk of the dynamic random access memory being damaged due to overheating is lowered.

Moreover, a scattering structure of the light-guiding portion makes the light projected from the light-emitting portion scatter to outside of the dynamic random access memory more evenly, and the light looks softer.

To achieve the above and other objects, a dynamic random access memory is provided, including a main body and a transmission port. The main body has a substrate, a light-emitting module and a light-guiding portion, the substrate is provided with a memory module, the light-emitting module has a carrier board and a light-emitting portion disposed on the carrier board, the light-guiding portion is arranged corresponding to the light-emitting portion, and at least a part of light from the light-emitting portion is projected to outside of the dynamic random access memory through the light-guiding portion. The transmission port is disposed on the substrate, and the transmission port is electrically connected with the memory module.

The present invention will become more obvious from the following description when taken in connection with the accompanying drawings, which show, for purpose of illustrations only, the preferred embodiment(s) in accordance with the present invention.

BRIEF DESCRIPTION OF THE DRAWINGS

FIG. 4 is a drawing showing the preferred embodiment of the present invention in use;

FIG. 6 is a drawing showing another preferred embodiment of the present invention in use.

DETAILED DESCRIPTION OF THE PREFERRED EMBODIMENTS

The present invention will be clearer from the following description when viewed together with the accompanying drawings, which show, for purpose of illustrations only, the preferred embodiment in accordance with the present invention.

Figure 1:
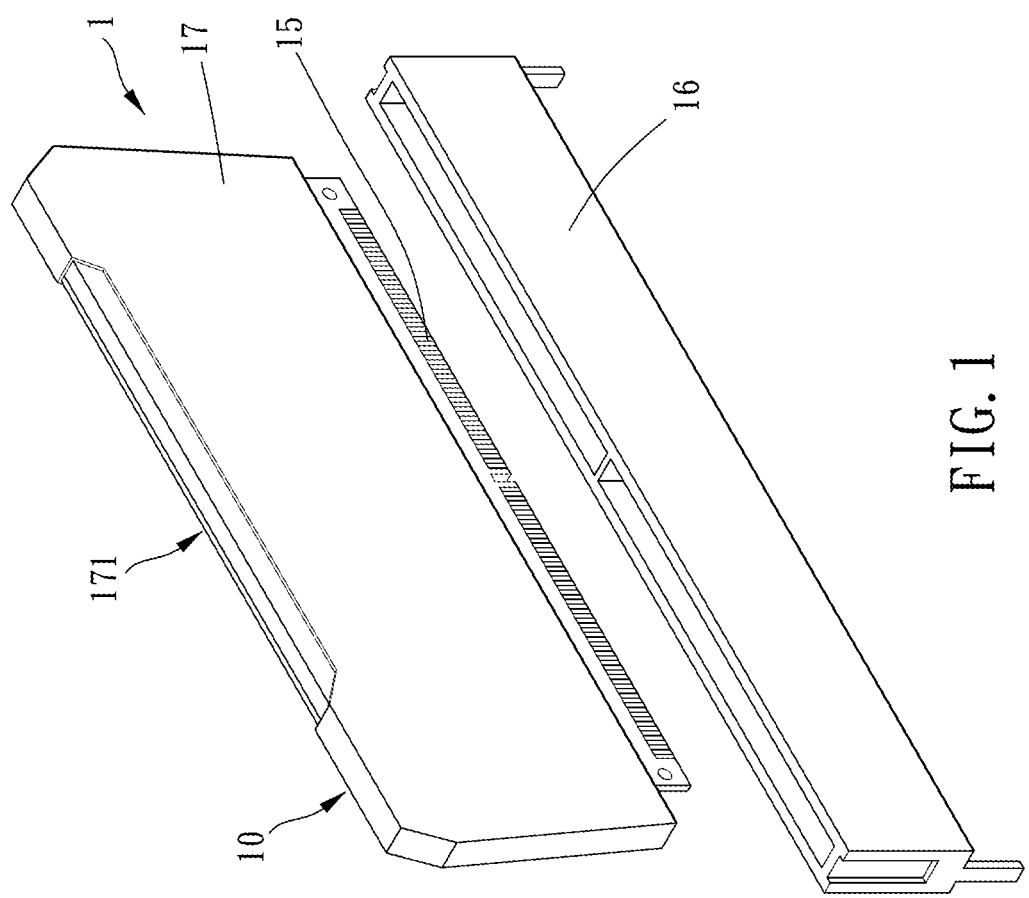
FIG. 1 is a perspective view of a preferred embodiment of the present invention.
Figure 2:
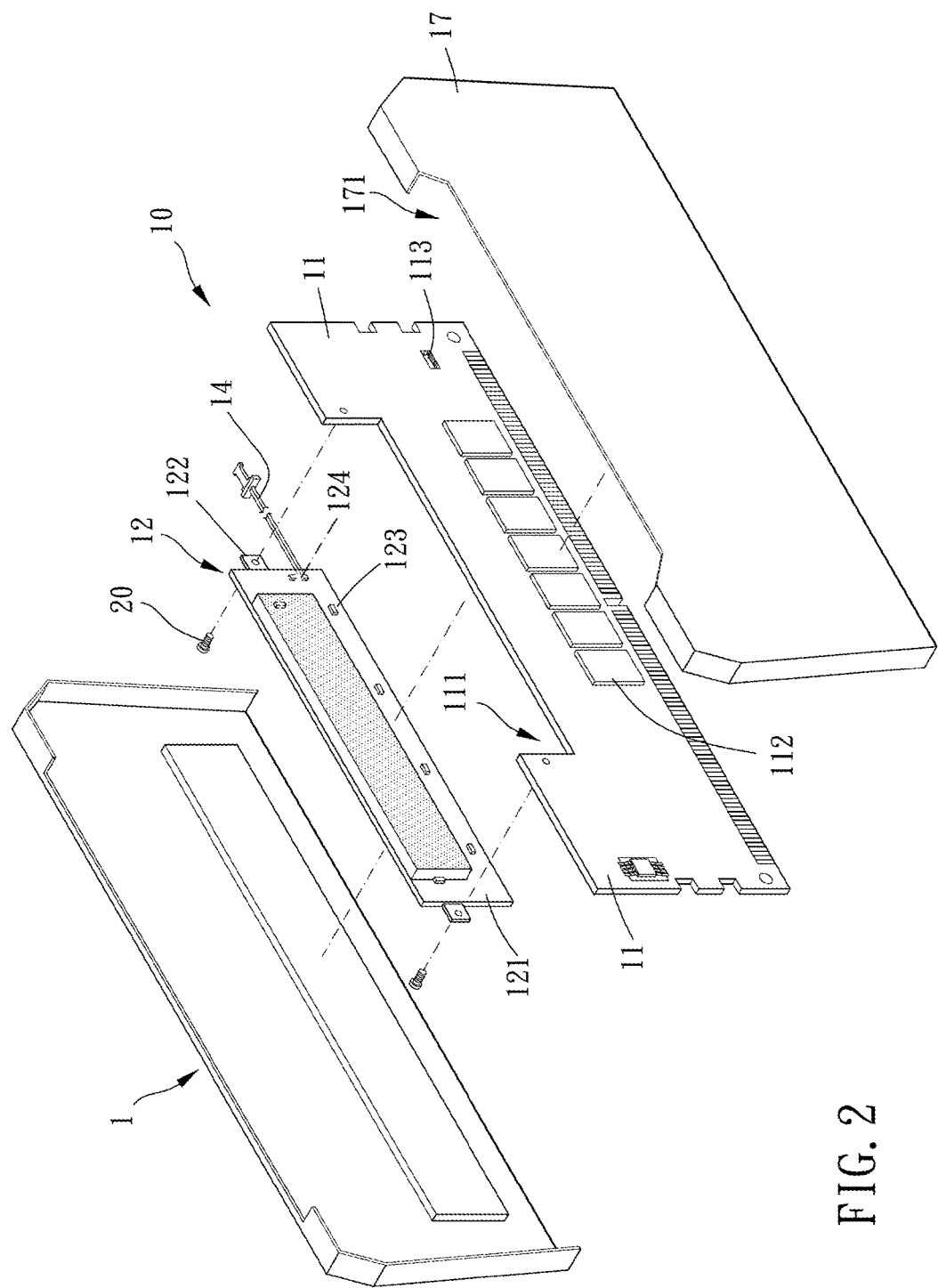
FIG. 2 is a breakdown view of the preferred embodiment of the present invention.
Figure 3:
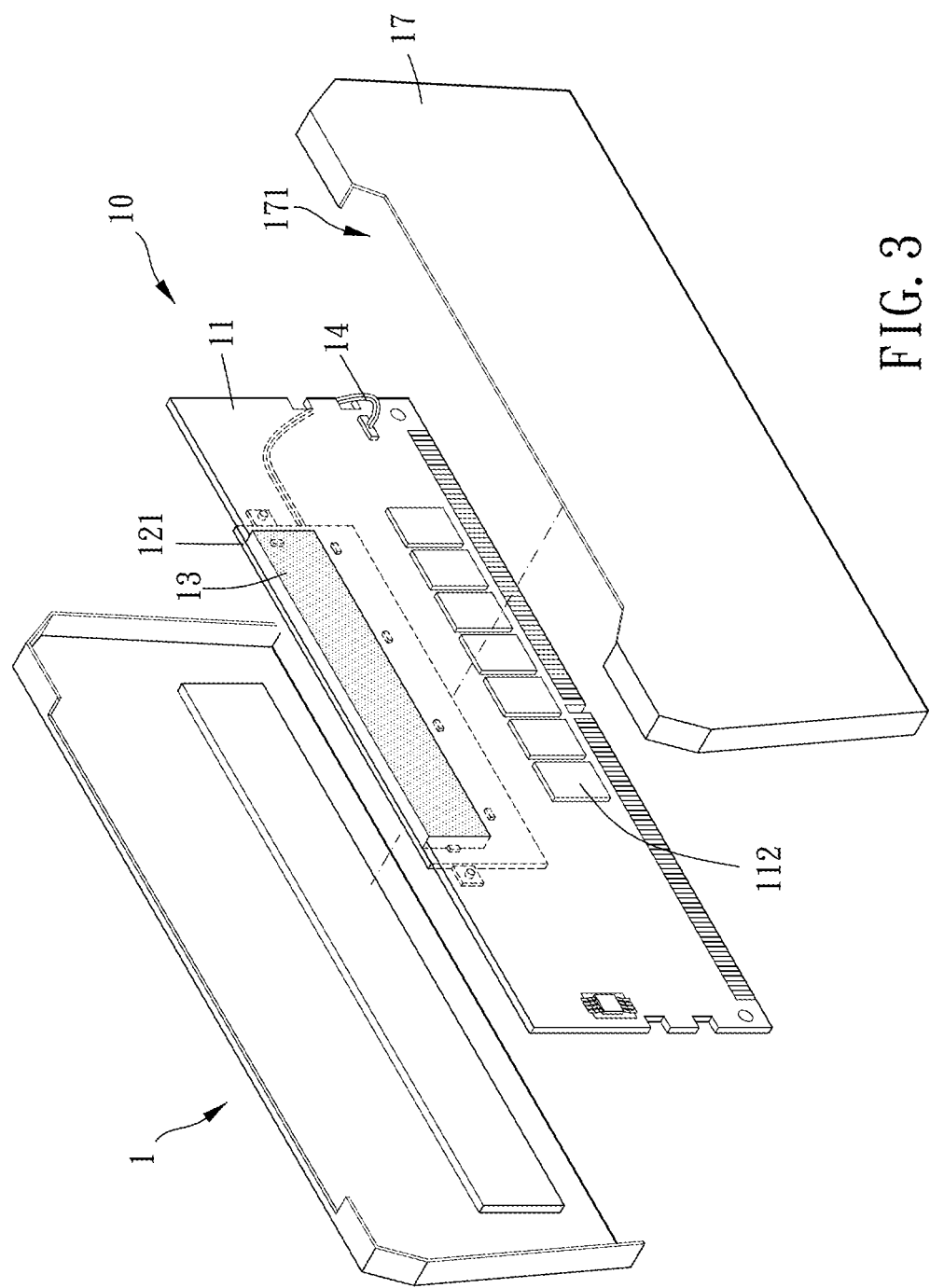
FIG. 3 is another breakdown view of the preferred embodiment of the present invention.
Figure 5:
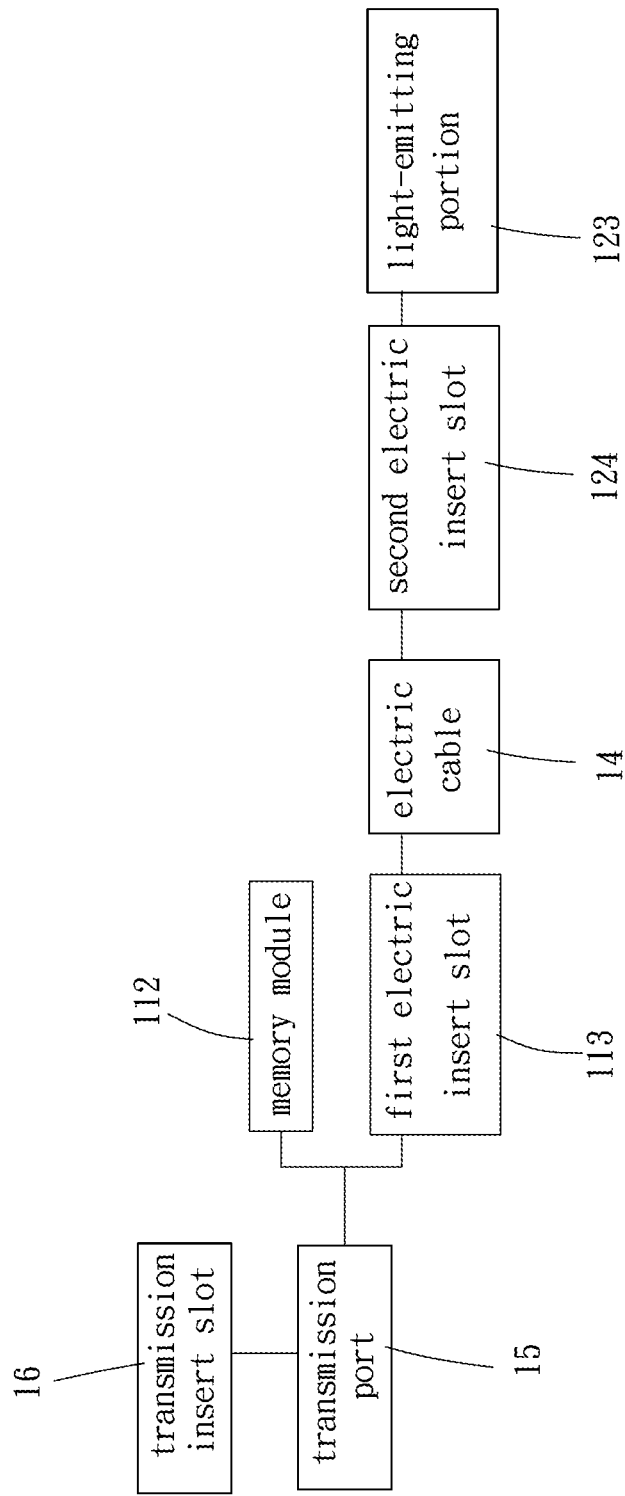
FIG. 5 is a diagram showing an electric relation of the preferred embodiment of the present invention.

Please refer to FIGS. 1 to 5 for a preferred embodiment of the present invention. A dynamic random access memory 1 includes a main body 10 and a transmission port 15.

The main body 10 has a substrate 11, a light-emitting module 12 and a light-guiding portion 13. The substrate 11 is provided with a memory module 112. The light-emitting module 12 has a carrier board 121 and a light-emitting portion 123 which is disposed on the carrier board 121, and the light-guiding portion 13 is arranged corresponding to the light-emitting portion 123.

The transmission port 15 is disposed on the substrate 11, the memory module 112 is electrically connected with the transmission port 15, and the transmission port 15 is for being electrically connected with a transmission insert slot 16. More specifically, the transmission port 15 can transmit not only power but also data. It is understandable that the transmission port 15 may be an insert row of PCI, PCI-E, IDE, USB, SATA or DDR in accordance with the transmission insert slots 16 of different mother boards.

The substrate 11 is formed with a first electric insert slot 113 which is electrically connected with the transmission port 15, the carrier board 121 is formed with a second electric insert slot 124 which is electrically connected with the light-emitting portion 123, the first electric insert slot 113 and the second electric insert slot 124 are electrically connected with each other through an electric cable 14 being inserted into the first electric insert slot 113 and the second electric insert slot 124, and the substrate 11 and the carrier board 121 are printed circuit boards so as to make the light-emitting portion 123 electrically connectable with the transmission port 15. In other embodiments, the carrier board and the substrate are not limited to being electrically connected through an insert slot and an electric cable, and the carrier board and the substrate may be electrically connected through welding; or, the light-emitting portion and the transmission port may not be electrically connected, instead, the electric cable may be connected to an external power (for example, an insert slot of a mother board).

The main body 10 further includes a shell 17, the shell 17 is covered on two opposite sides of the substrate 11, the shell 17 is provided with a light-penetrable portion 171, and at least a part of light from the light-emitting portion 123 can be projected to outside of the dynamic random access memory 1 through the light-guiding portion 13 and the light-penetrable portion 171. The light-penetrable portion 171 may be a layer made of a light-penetrable material or a hollow-out structure (or the light-guiding portion is engagedly assembled with the hollow-out structure), light projected from the light-guiding portion 13 can still be projected to the outside of the dynamic random access memory 1. In other embodiments, the shell may not be provided with the light-penetrable portion, and the light-emitting module and the light-guiding portion may be disposed on an outer surface of the shell and have the effect of light-emission and heat-dissipation.

Furthermore, the substrate 11 has a through hole 111, the light-guiding portion 13 is disposed into the through hole 111 (the carrier board may be engagedly disposed into the through hole) so that the light-guiding portion 13 occupies less space and that a volume of the dynamic random access memory 1 is decreased. The carrier board 121 is protrusively formed with at least one lateral wing 122, and the at least one lateral wing 122 is connected with the substrate 11. In this embodiment, the carrier board 121 is respectively protrusively formed with one said lateral wing 122 on two opposite ends thereof to make the carrier board 121 be fixed on the substrate 11. It is to be noted that the carrier board 121 and the substrate 11 may be connected with each other through welding, assembling or engagement. Besides, the carrier board may not be connected with the substrate but connected with the shell; or, the light-guiding portion is engagedly disposed on the shell to position the carrier board which is connected with the light-guiding portion.

The light-guiding portion 13 is formed with a scattering structure 131, the part of the light from the light-emitting portion 123 is projected toward the scattering structure 131 and scattered, penetrates through the light-guiding portion 13 evenly, and is projected to the outside of the dynamic random access memory 1. When viewed from the outside of the dynamic random access memory 1, the light is not concentrated and harsh to the eye.

In this embodiment, the scattering structure 131 is evenly distributed inside the light-guiding portion 13, and the part of the light from the light-emitting portion 123 is scattered through the scattering structure 131 and projected out from a circumferential side of the light-guiding portion 13. Specifically, the scattering structure 131 is composed of a plurality of scattering particles, and a material of the scattering particles is different from a material of the light-guiding portion 13; therefore, when the light is projected on the scattering particles, the light is scattered (reflected) or refracted to evenly distribute the light. It is understandable that the light-emitting portion 123 closely contacts the light-guiding portion 13 to make a transmission efficiency of light preferable; or, there is a proper distance between the light-emitting portion 123 and the light-guiding portion 13 to prevent the light-guiding portion 13 from being wore out due to heat of the light-emitting portion 123.

Specifically, the carrier board 121 is detachably connected to the substrate 11. The transmission port 15 is integrally disposed on the substrate 11. The substrate 11 and the light-emitting module 12 are separatably connected with each other. Each lateral wing 122 is thinner than the carrier board 121, and two fasteners 20 are detachably disposed through the two lateral wings 122 respectively and fixed to the substrate 11. The substrate 11 and the light-guiding portion 13 are plate-shaped, the substrate 11, the carrier board 121 and the light-guiding portion 13 are aligned with one another at top end, and the substrate 11 and the light-guiding portion 13 partially overlap with each other, and the light-emitting portion 123 is sandwiched between the substrate 11 and the carrier board 121.

Please refer to FIG. 6 for a light-guiding portion 13a of another embodiment. Compared with the embodiment of FIGS. 1 to 5, the light-guiding portion 13a has at least one incident surface 132a, a scatter surface 133a which is formed with a scattering structure 131a and an emergent surface 134a opposite to the scatter surface 133a, the light-emitting portion 123a is disposed next to the at least one incident surface 132a, light of the light-emitting portion 123a enters toward the at least one incident surface 132a, and a part of the light is scattered through the scattering structure 131a and penetrates through the emergent surface 134a. Specifically, the scattering structure 131a includes a concave-convex structure, and the light from the light-emitting portion 123a enters from two opposite end faces (incident surfaces) of the light-guiding portion 13a so that the light can penetrate through the emergent surface 134a more evenly after being scattered through the concave-convex structure. In other embodiments, the scattering structure may be a scattering dots structure which also allows the light to penetrate more evenly through an emergent surface.

Given the above, the light-emitting portion of the dynamic random access memory is not disposed on the substrate (the light-emitting portion is disposed on the carrier board), so when the light-emitting portion is damaged, the user only needs to replace the carrier board on which the light-emitting portion is disposed instead of replacing a whole set of dynamic random access memory.

In addition, the light-emitting portion is disposed on the carrier board instead of sharing a heat-dissipating area with the substrate; therefore, a heat-dissipating efficiency is elevated, and a risk of the dynamic random access memory being damaged due to overheating is lowered.

Moreover, a scattering structure of the light-guiding portion makes the light projected from the light-emitting portion scatter to the outside of the dynamic random access memory more evenly, and the light looks softer.

While we have shown and described various embodiments in accordance with the present invention, it should be clear to those skilled in the art that further embodiments may be made without departing from the scope of the present invention.

What is claimed is:

1. A dynamic random access memory, including:
a main body, having a substrate, a light-emitting module and a light-guiding portion, the substrate provided with a memory module, the light-emitting module having a carrier board detachably connected to the substrate and a light-emitting portion disposed on the carrier board, the light-guiding portion being arranged corresponding to the light-emitting portion, at least a part of light from the light-emitting portion being projected to outside of the dynamic random access memory through the light-guiding portion;
a transmission port, integrally disposed on the substrate and electrically connected with the memory module;
wherein the substrate and the light-emitting module are separatably connected with each other;
wherein the carrier board includes two lateral wings which respectively protrude on two opposite ends of the carrier board, each lateral wing is thinner than the carrier board, and two fasteners are detachably disposed through the two lateral wings respectively and fixed to the substrate;
wherein the substrate and the light-guiding portion are plate-shaped, the substrate, the carrier board and the light-guiding portion are aligned with one another at top end, and the substrate and the light-guiding portion partially overlap with each other, and the light-emitting portion is sandwiched between the substrate and the carrier board.

2. The dynamic random access memory of claim 1, wherein the light-guiding portion is formed with a scattering structure, the part of the light from the light-emitting portion is projected toward the scattering structure and scattered, penetrates through the light-guiding portion evenly, and is projected to the outside of the dynamic random access memory.

3. The dynamic random access memory of claim 2, wherein the scattering structure is evenly distributed inside the light-guiding portion, and the part of the light from the light-emitting portion is first projected toward the scattering structure and then projected out from a circumferential side of the light-guiding portion.

4. The dynamic random access memory of claim 2, wherein the light-guiding portion has at least one incident surface, a scatter surface having the scattering structure and an emergent surface opposite to the scatter surface, the light-emitting portion is disposed next to the at least one incident surface, the part of the light from the light-emitting portion enters toward the at least one incident surface, and the part of the light from the light-emitting portion is scattered through the scattering structure and penetrates through the emergent surface.

5. The dynamic random access memory of claim 4, wherein the scattering structure includes a concave-convex structure or a scattering dots structure.

6. The dynamic random access memory of claim 1, wherein the substrate has a through hole, and the light-guiding portion is disposed into the through hole.

7. The dynamic random access memory of claim 1, wherein the substrate has a first electric insert slot which is electrically connected with the transmission port, the carrier board has a second electric insert slot which is electrically connected with the light-emitting portion, and the first and second electric insert slots are electrically connected with each other through an electric cable inserting into the first and second electric insert slots.

8. The dynamic random access memory of claim 1, wherein the main body further includes a shell, the shell is covered on two opposite sides of the substrate, the shell is provided with a light-penetrable portion, and the at least the part of the light from the light-emitting portion is projectable to the outside of the dynamic random access memory through the light-guiding portion and the light-penetrable portion.

9. The dynamic random access memory of claim 8, wherein the light-penetrable portion is a layer made of a light-penetrable material or a hollow-out structure.

\* \* \* \* \*